United States Patent [19]
Wisherd et al.

[11] Patent Number: 5,338,974
[45] Date of Patent: Aug. 16, 1994

[54] RF POWER TRANSISTOR PACKAGE

[75] Inventors: David S. Wisherd, Sunnyvale, Calif.;
Howard D. Bartlow, Wilsonville, Oreg.

[73] Assignee: Spectrian, Inc., Mountain View, Calif.

[21] Appl. No.: 32,227

[22] Filed: Mar. 17, 1993

[51] Int. Cl.⁵ .............................................. H01L 23/48
[52] U.S. Cl. .................................... 257/691; 257/692; 257/698; 257/705; 257/773; 257/786; 257/666
[58] Field of Search ............... 257/691, 666, 692, 698, 257/705, 773, 786

[56] References Cited

U.S. PATENT DOCUMENTS

| | | | |
|---|---|---|---|
| 4,587,548 | 5/1986 | Grabbe et al. | 257/691 |
| 4,925,024 | 5/1990 | Ellenberger et al. | 206/328 |
| 5,115,298 | 5/1992 | Loh | 357/70 |
| 5,252,853 | 10/1993 | Michii | 257/691 |
| 5,252,854 | 10/1993 | Arita et al. | 257/691 |

Primary Examiner—Edward Wojciechowicz
Attorney, Agent, or Firm—Townsend and Townsend Khourie and Crew

[57] ABSTRACT

An RF power transistor is mounted on a ceramic substrate with a plurality of input leads extending from one edge of the substrate, a plurality of output leads extending from an opposite edge of the substrate, a plurality of input ground leads with ground leads positioned between adjacent input leads, and a plurality of output ground leads with ground lead positioned between adjacent output leads. All ground leads are ohmically connected with the current paths between adjacent ground leads reduced in length.

13 Claims, 5 Drawing Sheets

RF POWER TRANSISTOR PACKAGE

BACKGROUND OF THE INVENTION

This invention relates generally to transistor packages, and particularly the invention relates to RF, microwave, and high-power transistor packages and transistors where high gain and maximum stability must be obtained.

FIG. 1A is an exploded perspective view of a conventional RF power transistor package including a ceramic substrate 2, transistor 3, cover 4, leads 5 extending from the substrate 2, and wire bonds 6 connecting the transistor to the leads.

FIG. 1B is a plan view of the lead structure for the RF power transistor package. The leads are bonded to and extend from the ceramic substrate shown by dotted line 10. The transistor is mounted on a pad or island 12 centrally disposed (approximately) on the substrate and electrically isolated from the leads. An input lead 14 is positioned between ground leads 16, 18 on one side of the island 12, and an output lead 20 is positioned between the ground leads 16, 18 on the opposite side of the island 12. Wire bonds selectively connect the transistor emitter, base, and collector to the input, output, and ground leads. This lead frame has been in use for many years, but a major drawback of the lead structure lies in the current path length between the transistor ground leads.

SUMMARY OF THE INVENTION

The present invention reduces ground resistance and inductance, reduced input and output inductance, and improves stability and gain by providing shorter current paths in ground lead structures. A plurality of input leads and a plurality of output leads are provided in the new structure with ground leads provided between input leads and between output leads. Thus, the current path between leads is reduced with an attendant reduction in resistance and inductance of the current path. Further, the use of a plurality of input leads and a plurality of output leads reduces the input and output inductances, respectively.

The invention and objects and features thereof will be more readily apparent from the following detailed description and appended claims when taken with the drawing.

DETAILED DESCRIPTION OF ILLUSTRATIVE EMBODIMENTS

Figure 2:
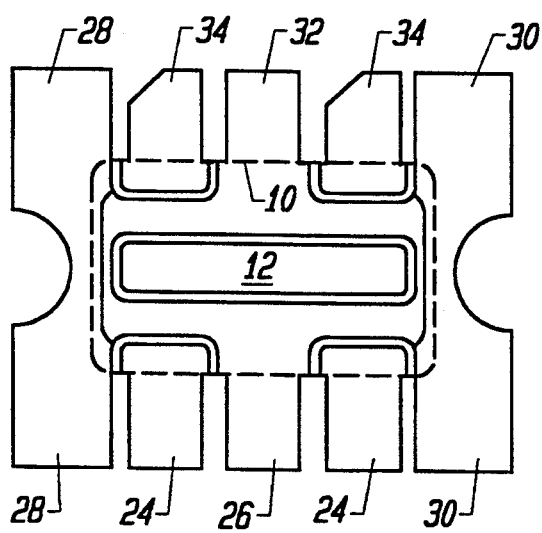
FIG. 2 is a plan view of a lead structure for an RF power transistor package in accordance with one embodiment of the invention.

FIG. 2 is a plan view of a lead structure in accordance of one embodiment of the invention. Again, a ceramic substrate 10 as indicated by broken lines and an island or pad 12 is centrally disposed (approximately) on the ceramic substrate for receiving the semiconductor chip. In this embodiment, two input leads 24 extend from one side of the ceramic substrate with an input ground lead 26 therebetween. Again, the ground leads 28, 30 are provided on either end of the ceramic substrate 10. Similarly, a pair of output leads 34 extend from the opposite side of the ceramic substrate 10 with an output ground lead 32 therebetween. The ground leads 28, 30 extend across the ends of the ceramic substrate.

Figure 1A:
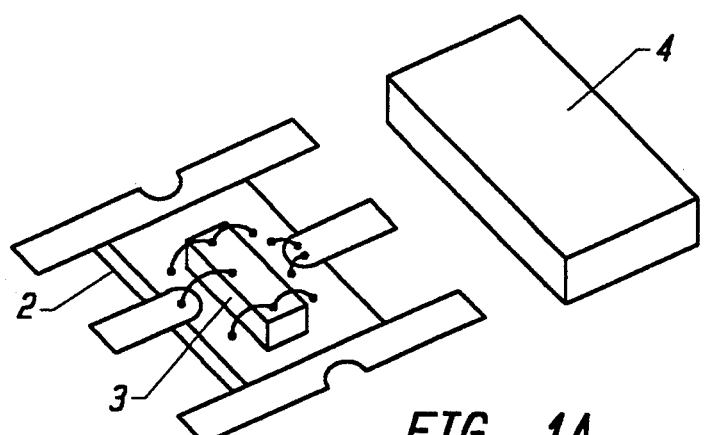
FIG. 1A is an exploded perspective view of a conventional RF power transistor and package.
Figure 1B:
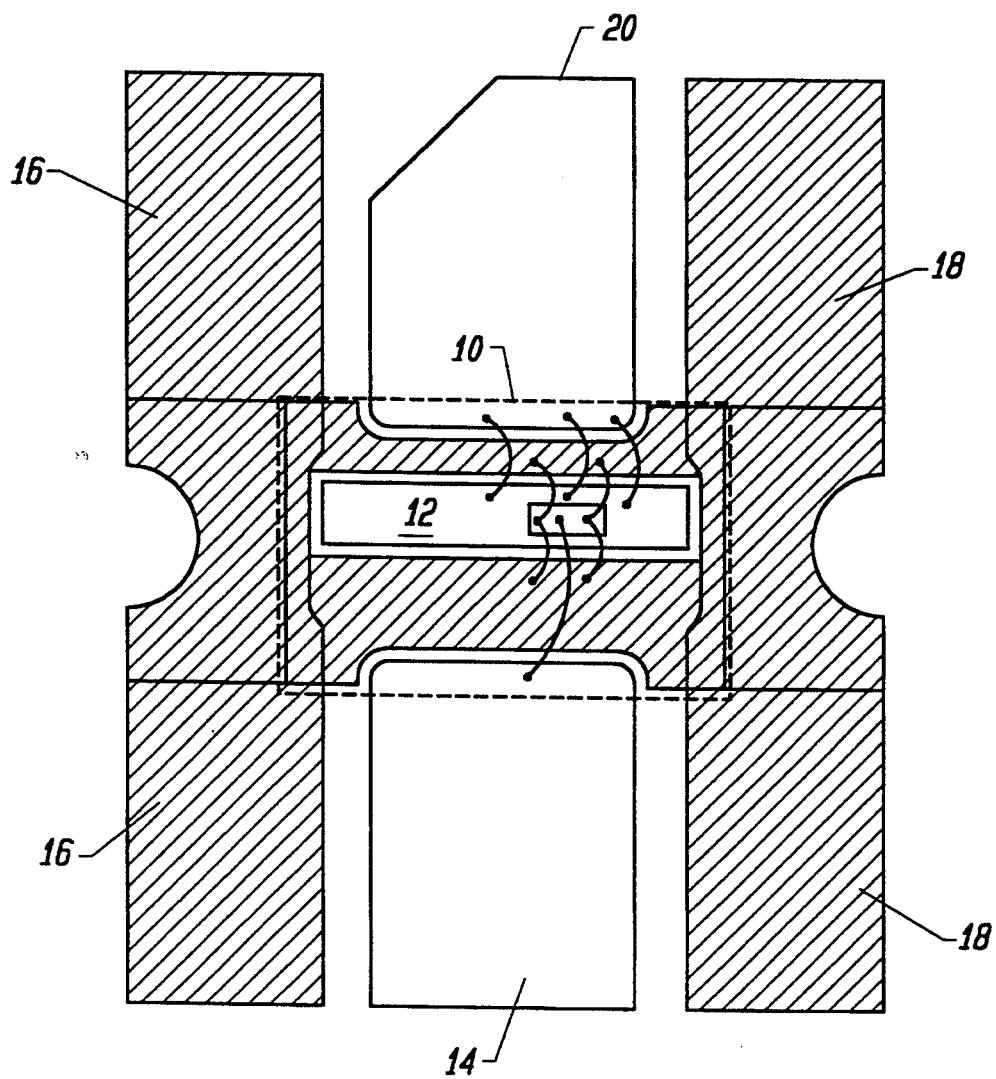
FIG. 1B is a plan view of the lead structure in the conventional RF power transistor.
Figure 3:
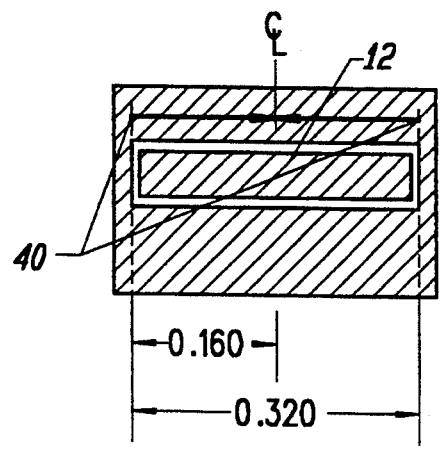
FIG. 3 and FIG. 4 illustrate current paths in the lead structures of FIG. 1 and FIG. 2, respectively.
Figure 4:
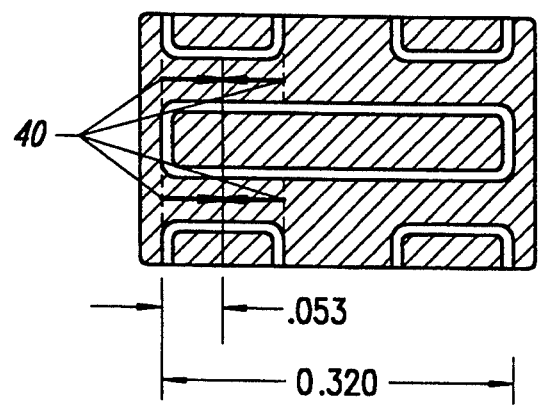

In the prior art structure of FIG. 1 and the embodiment of the invention in FIG. 2, the ceramic substrates 10 and islands 12 are the same size. However, since the single input and output leads of FIG. 1 are now replaced by a pair of input and output leads in FIG. 2, the current path lengths between the transistor and package ground are reduced by 65-70%. Referring to FIGS. 3 and 4, the length of the longest possible current path from the island to ground is illustrated. The island widths of the two embodiments are identical, so the current path of interest is the horizontal direction. The longest current path of the prior art is shown in FIG. 3 and designated by the numeral 40 with current flow indicated by the arrows. Assuming a common starting reference point for common lead current, i.e., at the top of the package at the starting points of the common lead buslines, the length of the path is from the center line to either side of the package, or a length of 0.160 inch.

FIG. 4 shows the improvements embodied in the configuration of FIG. 2. Using the same designation 40 as in FIG. 3, the starting points for the current path length are indicated by the arrows. Note that the island width of both the prior art and the invention is 0.300 inch, but the current path length of the embodiment of FIG. 2 is 0.053 inch, compared to 0.160 inch for the prior art lead structure of FIG. 1. Thus, the path length is reduced by a factor of 3. Accordingly, both resistance and inductance of these current paths are reduced by a factor of 3, thus improving stability and gain of the transistor.

Figure 5:
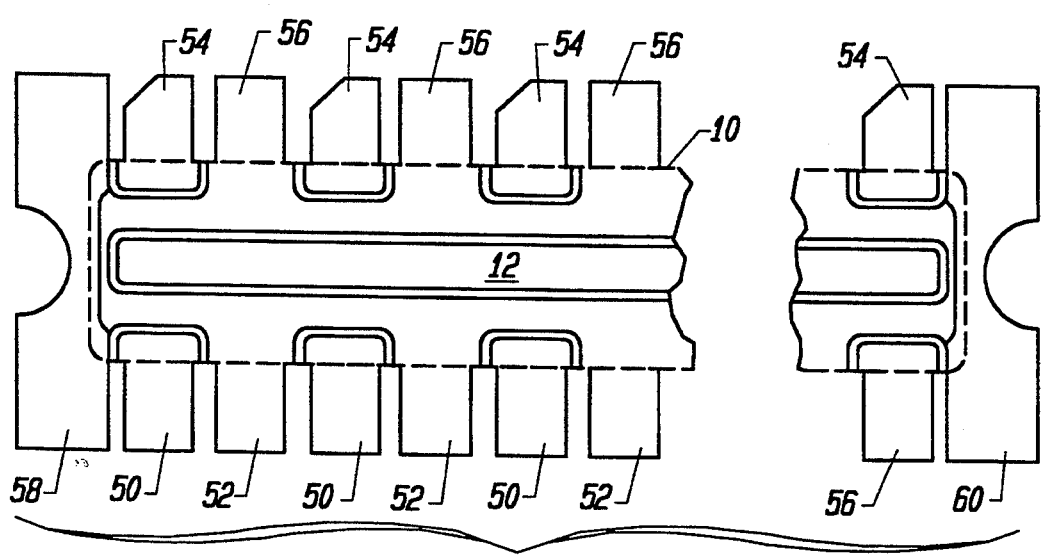
FIG. 5 is a plan view of a lead structure in accordance with another embodiment of the invention.

FIG. 5 is a plan view of another embodiment of the invention with the ceramic substrate again labeled 10 and the island labeled 12. The number of input leads 50 can be increased to any number with input ground leads 52 provided between the adjacent input leads. Similarly, the output leads 54 are increased by a like number with output ground leads 56 provided between adjacent output leads. The end ground leads 58, 60 are provided at either end of the ceramic package.

Figure 6:
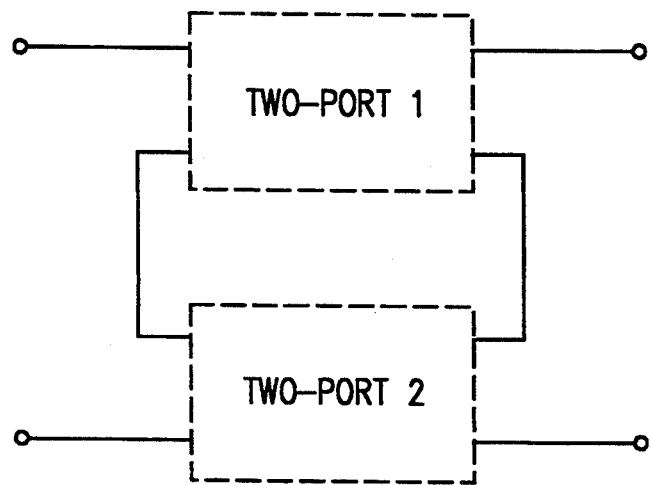
FIG. 6 and FIG. 7 are schematics of two port networks for use and analysis of the effects of current path length.

Using simple two-port analysis, the effects of current path length may be evaluated. FIG. 6 shows two-port networks that are connected in series. If the arbitrary two-port networks of FIG. 6 are replaced with the networks used in FIG. 7, a model of the transistor package is obtained. The current path to ground, as seen by the transistor, is modeled by the resistor/inductor combination in FIG. 7. Thus, the current path may be modeled as variable series feedback of a two-port network. As the current path length is increased, the magnitude of the series feedback also increases.

In a common-emitter configuration, the gain of the two-port network increases as the series feedback is reduced. from the previous current flow analysis, the improved RF and microwave power transistor package yields a shorter current path (lower series feedback), and hence increased gain over the conventional design.

Figure 7:
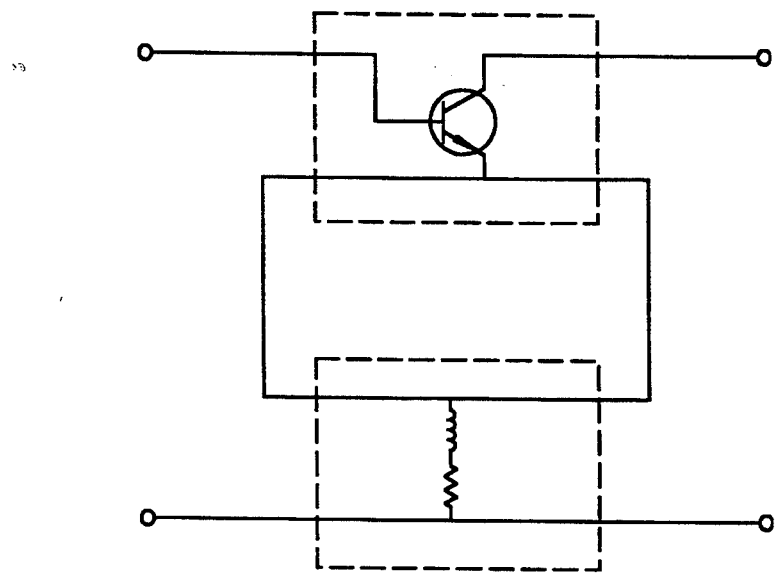

If the transistor in FIG. 7 is reconfigured to a common-base transistor, reduction of the series feedback impedance yields increased stability. Thus, regardless of the transistor topology, the improved power RF and microwave transistor package yields improved stability and gain.

A further benefit of this invention is significantly reduced cost of the package when compared with prior art RF transistor packages, as well as thermal impedance improvements of about 30% or more.

There has been described an improved RF power transistor package and lead structure which improves gain and stability of an RF power transistor. While the invention has been described with reference to specific embodiments, the description is illustrative of the invention and is not to be construed as limiting the invention. Various modifications and applications may occur to those skilled in the art without departing from the true spirit and scope of invention as defined by the appended claims.

What is claimed is:

1. A lead structure for an RF power transistor comprising:
    a ceramic substrate having opposing sides and opposing ends,
    an approximately centrally disposed pad for mounting a semiconductor chip on one side of said substrate,
    a plurality of input leads attached to and extending from said ceramic substrate on one side of said substrate,
    a plurality of input ground leads attached to and extending from said ceramic substrate with an input ground lead positioned between all adjacent input leads,
    a plurality of output leads attached to and extending from said ceramic substrate on an opposite side of said substrate, and
    a plurality of output ground leads attached to and extending from said ceramic substrate with an output ground lead positioned between all adjacent output leads.

2. The lead structure as defined by claim 1 and further including two integral input and output ground leads extending from said ceramic substrate at said opposing ends of said ceramic substrate and integral with all of said plurality of input ground leads and said plurality of output ground leads.

3. The lead structure as defined by claim 2 and including two input leads and two output leads, an input ground lead between said two input leads, and an output ground lead between said two output leads.

4. The lead structure as defined by claim 3 wherein said two integral input and output ground leads are ohmically connected with said input ground lead and with said output ground lead.

5. The lead structure as defined by claim 2 wherein said plurality of input leads exceeds two in number and said plurality of output leads exceeds two in number.

6. The lead structure as defined by claim 5 wherein said two integral input and output ground leads are ohmically connected with said plurality of input ground leads and said plurality of output ground leads.

7. The lead structure as defined by claim 6 wherein the number of input leads is n, and the number of input ground leads is n+1 whereby input ground leads are provided at each end of said plurality of input leads.

8. The lead structure as defined by claim 7 wherein the number of output leads is n, and the number of output ground leads is n+1 whereby output ground leads are provided at each end of said plurality of output leads.

9. The lead structure as defined by claim 1 wherein the number of input leads is n, and the number of input ground leads is n+1 whereby input ground leads are provided at each end of said plurality of input leads.

10. The lead structure as defined by claim 1 wherein the number of output leads is n, and the number of output ground leads is n+1 whereby output ground leads are provided at each end of said plurality of output leads.

11. The lead structure as defined by claim 1 and including a semiconductor transistor mounted on said approximately centrally disposed pad.

12. The lead structure as defined by claim 7 and further including wire bonds selectively interconnecting said transistor to said plurality of input leads, said plurality of output leads, and said plurality of ground leads.

13. The lead structure as defined by claim 8 and further including a cover affixed to said ceramic substrate for encapsulating said semiconductor transistor.

* * * * *